(12) United States Patent
Iwama

(10) Patent No.: US 10,884,204 B2
(45) Date of Patent: Jan. 5, 2021

(54) OPTICAL MODULE AND LIQUID IMMERSION SYSTEM

(71) Applicant: FUJITSU LIMITED, Kawasaki (JP)

(72) Inventor: Masahiro Iwama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/507,105

(22) Filed: Jul. 10, 2019

(65) Prior Publication Data

US 2020/0026010 A1 Jan. 23, 2020

(30) Foreign Application Priority Data

Jul. 23, 2018 (JP) .................................. 2018-137849

(51) Int. Cl.
*G02B 6/42* (2006.01)
*H04B 10/40* (2013.01)
*H05K 7/20* (2006.01)
*F21V 29/50* (2015.01)

(52) U.S. Cl.
CPC ........... *G02B 6/4268* (2013.01); *H04B 10/40* (2013.01); *H05K 7/20236* (2013.01); *F21V 29/50* (2015.01)

(58) Field of Classification Search
CPC .... H05K 7/20218–20272; F21V 29/50; G02B 6/4266; G02B 6/4268; H01R 13/6581; H01R 24/28; H01R 24/64; H01R 25/006; H01R 2107/00
See application file for complete search history.

(56) References Cited

U.S. PATENT DOCUMENTS

| 9,419,380 | B2 * | 8/2016 | Sharf ................... H01R 12/724 |
| 9,593,876 | B2 * | 3/2017 | Smith ................ H05K 7/20218 |
| 2014/0321053 | A1 * | 10/2014 | Donnelly ........... H05K 7/20236 361/691 |

FOREIGN PATENT DOCUMENTS

| JP | 2004-31763 | 1/2004 |
| JP | 2009-64985 | 3/2009 |

* cited by examiner

*Primary Examiner* — Zachary Pape
(74) *Attorney, Agent, or Firm* — Fujitsu Patent Center

(57) ABSTRACT

An optical module includes an optical transmission device including a heating element, an optical element, an optical cable and an optical coupling unit that performs optical coupling between the optical element and one end of the optical cable; and a container that houses the heating element, the optical element, the optical coupling unit, and a portion including the one end of the optical cable, the container having an opening located between the heating element and the optical coupling unit in a direction in which the heating element and the optical coupling unit are arranged, the container having a portion located closer to the optical coupling unit than the opening in the arrangement direction wherein the portion is sealed.

8 Claims, 17 Drawing Sheets

OPTICAL MODULE AND LIQUID IMMERSION SYSTEM

CROSS-REFERENCE TO RELATED APPLICATION

This application is based upon and claims the benefit of priority of the prior Japanese Patent Application No. 2018-137849, filed on Jul. 23, 2018, the entire contents of which are incorporated herein by reference.

FIELD

The embodiments discussed herein are related to an optical module and a liquid immersion system.

BACKGROUND

In recent years, with the increase in density and speed of an optical transmission device that performs optical communication, heat generated from the optical transmission device has become a problem. A method of cooling the optical transmission device includes liquid immersion in which the optical transmission device is immersed in a coolant. For example, a configuration is known in which a package that houses a light emitting diode chip is provided with a cooling chamber for immersing the light emitting diode chip in a cooling fluid. It is known that a container provided with a light emitting element is provided with a refrigerant reservoir containing a refrigerant, and the light emitting element is immersed in the refrigerant reservoir.

Examples of the related art include Japanese Laid-open Patent Publication No. 2009-064985 and Japanese Laid-open Patent Publication No. 2004-031763.

However, in the related art described above, when the optical transmission device is immersed in the coolant, the coolant may enter the optical path in the optical transmission device, and the refractive index in the optical path in the optical transmission device may change. When the refractive index in the optical path in the optical transmission device changes, there is the problem in that the coupling ratio of light in the optical path decreases, and the light transmission characteristics in the optical transmission device are degraded.

In view of the above, it is desirable to provide an optical module and a liquid immersion system capable of suppressing degradation of the light transmission characteristics when the heating element of the optical transmission device is cooled by a liquid.

SUMMARY

According to an aspect of the embodiments, an optical module includes an optical transmission device including a heating element, an optical element, an optical cable and an optical coupling unit that performs optical coupling between the optical element and one end of the optical cable; and a container that houses the heating element, the optical element, the optical coupling unit, and a portion including the one end of the optical cable, the container having an opening located between the heating element and the optical coupling unit in a direction in which the heating element and the optical coupling unit are arranged, the container having a portion located closer to the optical coupling unit than the opening in the arrangement direction wherein the portion is sealed.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments of an optical module and a liquid immersion system according to the present disclosure will be described in detail with reference to the drawings.

Embodiments (Liquid Immersion System and Optical Module According to the Embodiments)

Figure 1:
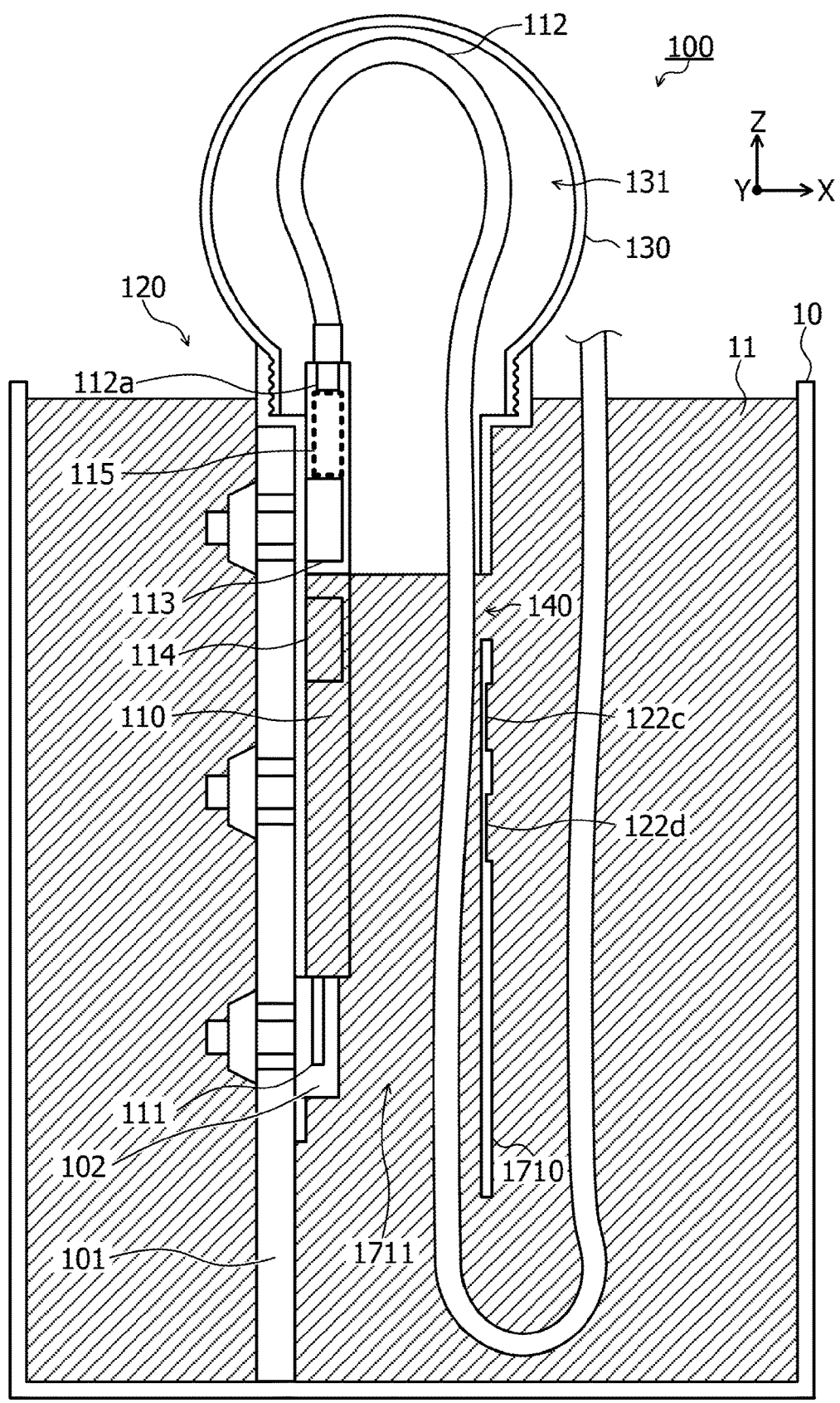
FIG. 1 is a front sectional view illustrating an example of a liquid immersion system and an optical module according to an embodiment.

FIG. 1 is a front sectional view illustrating an example of a liquid immersion system and an optical module according to an embodiment. As illustrated in FIG. 1, the liquid immersion system according to the embodiment includes a coolant tank 10 and an optical module 100. The coolant tank 10 contains a coolant 11 for cooling the optical module 100.

The coolant 11 cools the optical module 100. For example, the coolant 11 is a fluorine-based inert liquid such as Fluorinert (registered trademark). The cooling efficiency when a natural convection heat transfer is applied using a fluorine-based inert liquid such as Fluorinert is, for example, about five times the cooling efficiency when a forced air flow is applied. However, the coolant 11 is not limited to Fluorinert, and may be, for example, various liquids such as transformer oil, silicone oil, and water.

The optical module 100 includes a printed circuit board 101, a QSFP module 110, a first cage member 120, and a second cage member 130. The QSFP is an abbreviation for Quad Small Form-factor Pluggable.

The printed circuit board 101 is fabricated by providing an electronic component on the front surface of the printed wiring board. For example, a female QSFP connector 102 for connecting a male QSFP connector 111 of the QSFP module 110 is provided on the front surface of the printed circuit board 101. A control circuit such as a central processing unit (CPU) that controls the QSFP module 110 may be provided on the front surface of the printed circuit board 101.

The QSFP module 110 is an optical transmission device that transmits and/or receives an optical signal. The QSFP module 110 may be, for example, an active optical cable (AOC) in which an optical transceiver and an optical fiber cable are integrated.

For example, the QSFP module 110 includes the male QSFP connector 111, an optical cable 112, an optical element 113, a heating element 114, and an optical coupling unit 115. The male QSFP connector 111, one end 112a of the optical cable 112, the optical element 113, the heating element 114 and the optical coupling unit 115 are mounted on, for example, the front surface of the substrate inside the QSFP module 110.

The housing of the QSFP module 110 is not sealed. Therefore, components provided inside a portion of the QSFP module 110, where the portion is immersed in the coolant 11, are immersed in the coolant 11. On the other hand, components provided inside a portion of the QSFP module 110, where the portion is not immersed in the coolant 11, are not immersed in the coolant 11. The term "sealed" means that the liquid does not flow into the interior which is closed without any gap (having watertightness) in an environment where pressure is applied.

The longitudinal direction (vertical direction in FIG. 1) of the portion of the QSFP module 110 excluding the optical cable 112 is taken as the Z-axis direction. Of the Z-axis direction, the male QSFP connector 111 side direction of the QSFP module 110 (downward in FIG. 1) is the negative direction of the Z-axis, and the direction opposite the negative direction of the Z-axis (upward in FIG. 1) is the positive direction of the Z-axis. The respective directions each orthogonal to the Z-axis direction and orthogonal to each other (the lateral direction and the depth direction in FIG. 1) are taken as the X-axis direction and the Y-axis direction.

As illustrated in FIG. 1, the heating element 114 is provided at a position of the positive direction of the Z-axis relative to the male QSFP connector 111. The optical element 113 is provided at a position of the positive direction of the Z-axis relative to the heating element 114. The one end 112a of the optical cable 112 is provided at a position of the positive direction of the Z-axis relative to the optical element 113. The optical coupling unit 115 is a region between the optical element 113 and the one end 112a of the optical cable 112 in the Z-axis direction.

The optical cable 112 is a cable, such as an optical fiber, capable of transmitting an optical signal. The optical element 113 includes at least one of a light emitting element and a light receiving element. The light emitting element is, for example, a laser diode (LD). The light receiving element is, for example, a photo diode (PD). When the optical element 113 includes a light emitting element, the QSFP module 110 transmits an optical signal. When the optical element 113 includes a light receiving element, the QSFP module 110 receives an optical signal.

The heating element 114 is an object that generates heat as the optical element 113 is driven, and is a main target to be cooled by the coolant 11. When the optical element 113 includes a light emitting element, the heating element 114 includes, for example, a drive circuit that generates a drive current of the light emitting element. When the optical element 113 includes a light receiving element, the heating element 114 includes, for example, an amplification circuit that converts the output current of the light receiving element into a voltage.

The optical coupling unit 115 performs optical coupling between the optical element 113 and the one end 112a of the optical cable 112. For example, when the optical element 113 includes a light emitting element, the optical coupling unit 115 couples the light emitted from the optical element 113 to the one end 112a of the optical cable 112. When the optical element 113 includes a light receiving element, the optical coupling unit 115 couples the light emitted from the one end 112a of the optical cable 112 to the optical element 113. The optical coupling unit 115 may be made by using, for example, an optical system using lenses or the like arranged at predetermined intervals. An example of the optical coupling unit 115 will be described later (for example, see FIG. 2).

The optical coupling unit 115 includes a space on the optical path between the optical element 113 and the one end 112a of the optical cable 112. The space is, for example, a portion (free space) where any object included in the optical module 100 does not exist. This space communicates with the outside of the QSFP module 110. Thus, when the QSFP module 110 is in air, this space is filled with air. When the QSFP module 110 is in liquid, this space is filled with the liquid. The refractive index on the optical path between the optical element 113 and the one end 112a of the optical cable 112 is changed by the substance that fills the space of the optical coupling unit 115, whereby an efficiency of the optical coupling between the optical element 113 and the one end 112a of the optical cable 112 changes.

For example, the optical coupling unit 115 is designed such that the efficiency of the optical coupling between the optical element 113 and the one end 112a of the optical cable 112 is maximized on the premise that the space of the optical coupling unit 115 is filled with air. In this case, when the coolant 11 enters the space of the optical coupling unit 115, the refractive index on the optical path between the optical element 113 and the one end 112a of the optical cable 112 changes, and the efficiency of the optical coupling between the optical element 113 and the one end 112a of the optical cable 112 is reduced. On the other hand, according to the optical module 100 according to the embodiment, as described later, it is possible to suppress entry of the coolant 11 into the space of the optical coupling unit 115.

The first cage member 120 and the second cage member 130 are coupled to one another to form a container that houses a portion of the QSFP module 110. For example, the first cage member 120 includes a first housing portion 121 and a second housing portion 122, and the first housing portion 121 of the first cage member 120, the second housing portion 122 of the first cage member 120, and the second cage member 130 are coupled without any gap to form the container. The portion of the QSFP module 110 housed in the container is a portion including the heating element 114, the optical element 113, the optical coupling unit 115, and the one end 112a of the optical cable 112, which are described above. The structures of the first cage member 120 and the second cage member 130 will be described later (see, for example, FIGS. 3 to 6).

The first housing portion 121 is fixed to the printed circuit board 101, and the QSFP module 110 is housed in a space 121a in the first housing portion 121. For the optical cable 112 described above, the portion extending from the one end 112a extends from the space 121a in the first housing portion 121 to a space 131 in the second cage member 130, and is folded back to the second housing portion 122 side in the space 131 (the negative direction of the Z-axis). The optical cable 112 passes through a space 122a in the second housing portion 122, and is coupled to, for example, another optical transmission device provided outside the coolant tank 10, where the another optical transmission device performs light transmission with the QSFP module 110.

The container formed by the first cage member 120 and the second cage member 130 has a liquid immersion position adjustment opening 140 at a portion located between the heating element 114 and the optical coupling unit 115 in the direction in which the heating element 114 and the optical coupling unit 115 are arranged. The arrangement direction of the heating element 114 and the optical coupling unit 115 is, for example, a direction parallel to a straight line connecting the heating element 114 and the optical coupling unit 115 at the shortest distance (that is, the Z-axis direction). The portion located between the heating element 114 and the optical coupling unit 115 in the Z-axis direction is a portion whose position in the Z-axis direction is located between the position of the heating element 114 in the Z-axis direction and the position of the optical coupling unit 115 in the Z-axis direction irrespective of where the position is located in the X-axis direction and the Y-axis direction.

In the example illustrated in FIG. 1, the liquid immersion position adjustment opening 140 is provided on the face of the second housing portion 122 of the first cage member 120 at a position of the positive direction of the X-axis. The liquid immersion position adjustment opening 140 is a through hole communicating the interior and the exterior of the container formed by the first cage member 120 and the second cage member 130. The position of the liquid immersion position adjustment opening 140 will be described later (see, for example, FIG. 2).

The container is sealed at a portion located closer to the optical coupling unit 115 (the positive direction of the Z-axis) than the liquid immersion position adjustment opening 140 in the Z-axis direction. For example, the container formed by the first cage member 120 and the second cage member 130 does not have a gap which air or the coolant 11 may enter and exit from at a position of the positive direction of the Z-axis relative to the liquid immersion position adjustment opening 140. The portion located closer to the optical coupling unit 115 than the liquid immersion position adjustment opening 140 in the Z-axis direction means a portion whose position in the Z-axis direction is located at the positive direction relative to the position of the liquid immersion position adjustment opening 140 in the Z-axis direction irrespective of where the position is located in the X-axis direction and the Y-axis direction.

The optical module 100 described above is immersed into the coolant 11 in with which the coolant tank 10 is filled in an orientation in which the heating element 114 is located below the optical coupling unit 115 (directed to the gravity direction) (that is, the negative direction of the Z-axis is directed to the gravity direction). At this time, the optical module 100 is immersed in the coolant 11 so that at least the liquid immersion position adjustment opening 140 is immersed in the coolant 11. In the example illustrated in FIG. 1, the optical module 100 is immersed to the extent that the first cage member 120 is immersed in the coolant 11 and the second cage member 130 is not immersed in the coolant 11. For example, all of the first cage member 120 and the second cage member 130 may be immersed in the coolant 11.

As a result, of the space in the container formed by the first cage member 120 and the second cage member 130, a space at a position of the positive direction of the Z-axis relative to the liquid immersion position adjustment opening 140 is filled with air. Of the space in the container, a space having the position in the Z-axis direction same as the position of the liquid immersion position adjustment opening 140 and a space at a position of the negative direction of the Z-axis relative to the liquid immersion position adjustment opening 140 are filled with the coolant 11.

Therefore, it is possible to immerse in the coolant 11 the heating element 114 located at a position of the negative direction of the Z-axis relative to the liquid immersion position adjustment opening 140 and it is possible not to immerse in the coolant 11 the optical coupling unit 115 located on the positive direction of the Z-axis relative to the liquid immersion position adjustment opening 140.

Therefore, while cooling the heating element 114 to be cooled by the coolant 11, entry of the coolant 11 into the space of optical coupling unit 115 is suppressed, so that it is possible to suppress the degradation in the efficiency of the optical coupling between the optical element 113 and the one end 112a of the optical cable 112. Suppressing the degradation in the efficiency of the optical coupling between the optical element 113 and the one end 112a of the optical cable 112 makes it possible to suppress the degradation in the light transmission characteristics in the QSFP module 110.

For example, compared with a configuration in which the QSFP module 110 is completely sealed so that the QSFP module 110 is not immersed in the coolant 11, the degradation in the heat dissipation performance of the QSFP module 110 and the price increase in the QSFP module 110 are suppressed. Compared with a configuration in which the QSFP module 110 is not immersed in the coolant 11 by choosing a specially shaped substrate at the expense of high-speed transmission quality with, for example, the wiring lengthened, the degradation in the high-speed transmission quality and the price increase in the optical module 100 are suppressed.

In the optical module 100, the space of the optical coupling unit 115 is filled with air regardless of the environment in which the optical module 100 is used. Therefore, even when the design of the optical coupling unit 115 is not changed according to the refractive index of the environment in which the optical module 100 is used, the degradation in the efficiency of the optical coupling between the optical element 113 and the one end 112a of the optical cable 112 is suppressed. For example, it is possible to use, in the coolant 11, the optical module 100 including the QSFP module 110 in which the optical coupling unit 115 is designed on the premise of use in air.

Although the case where the optical module 100 is immersed in the coolant 11 in the coolant tank 10 has been described, for example, the optical module 100 may be disposed in the coolant tank 10 not containing the coolant 11 and then the coolant tank 10 may be filled with the coolant 11. Also in this case, the state illustrated in FIG. 1 is obtained.

(Optical Coupling Unit, Heating Element and Liquid Immersion Position in the Liquid Immersion System According to the Embodiment)

Figure 2:
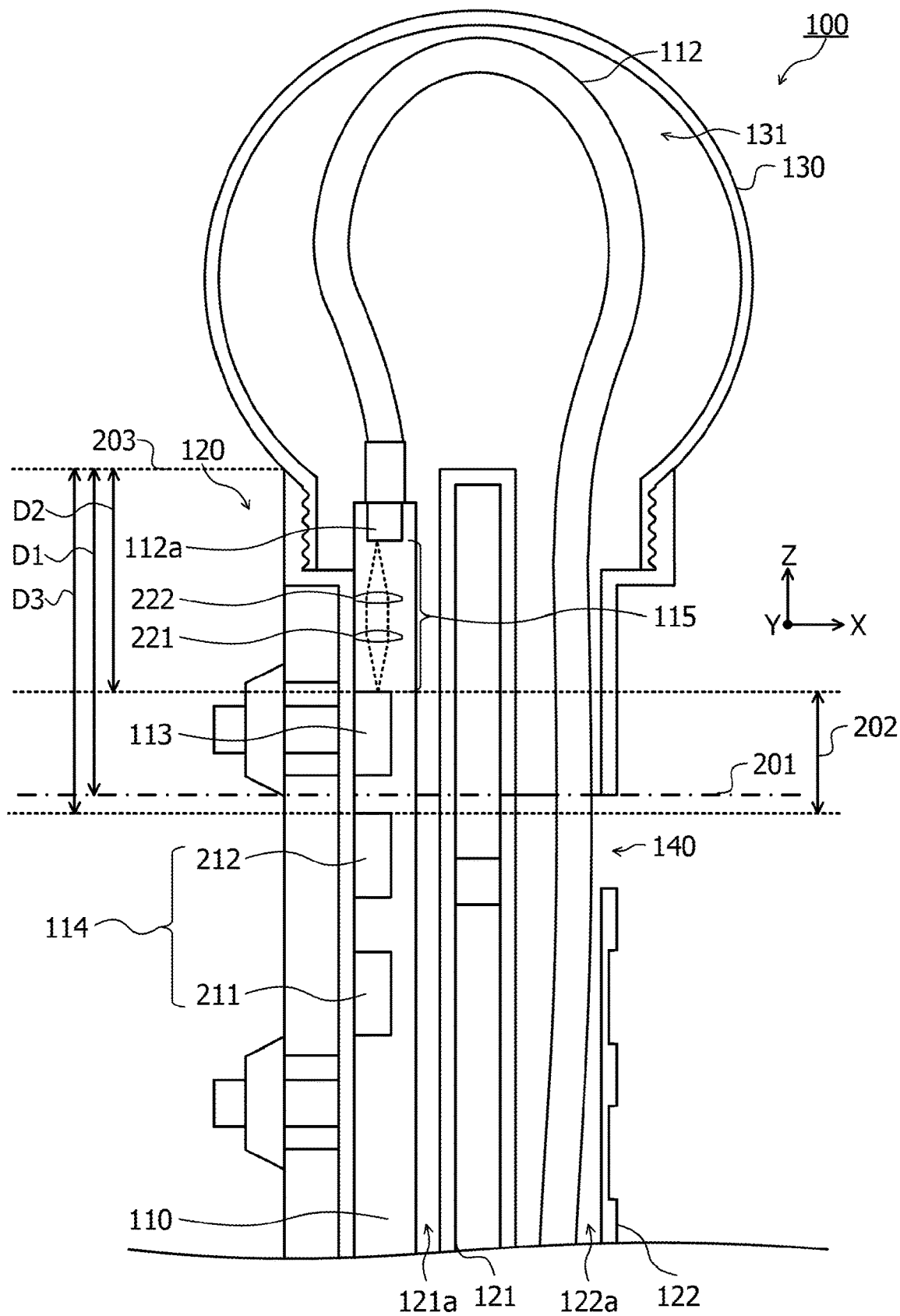
FIG. 2 is a view illustrating an example of an optical coupling unit, a heating element, and a liquid immersion position in the liquid immersion system according to the embodiment.

FIG. 2 is a view illustrating an example of an optical coupling unit, a heating element, and a liquid immersion position in the liquid immersion system according to the embodiment. In FIG. 2, the same parts as those illustrated in FIG. 1 are denoted by the same reference numerals and description thereof is omitted. As illustrated in FIG. 2, the optical coupling unit 115 illustrated in FIG. 1 includes lenses 221 and 222 as an example. In this case, the space which the optical coupling unit 115 described above includes, for example, the space between the optical element 113 and the lens 221, the space between the lenses 221 and 222, and the space between the lens 222 and the one end 112a of the optical cable 112.

For example, when the optical element 113 includes a light emitting element, the lens 221 collimates the light emitted from the optical element 113 and emits the collimated light to the lens 222. In this case, the lens 222 condenses the light emitted from the lens 221 on the one end 112a of the optical cable 112.

When the optical element 113 includes a light receiving element, the lens 222 collimates the light emitted from the one end 112a of the optical cable 112 and emits the collimated light to the lens 221. In this case, the lens 221 condenses the light emitted from the lens 222 on the optical element 113.

For example, when the optical element 113 includes a light emitting element, as illustrated in FIG. 2, the heating element 114 illustrated in FIG. 1 includes, as an example, a CDR circuit 211 and a drive circuit 212. The CDR circuit 211 performs a clock data recovery (CDR) of a data signal to be transmitted by the QSFP module 110 by light. The drive circuit 212 generates a drive signal based on the data signal reproduced by the CDR of the CDR circuit 211 to supply the generated drive signal to a light emitting element (for example, LD) of the optical element 113.

A liquid immersion position 201 illustrated in FIG. 2 is the height of the liquid surface of the coolant 11 (the position in the Z-axis direction) in the interior of the container formed by the first cage member 120 and the second cage member 130, for example, when the optical module 100 is immersed in the coolant 11 as illustrated in FIG. 1. As illustrated in FIG. 2, the liquid immersion position 201 is the height of the upper end of the liquid immersion position adjustment opening 140 (the position of the most positive direction of the Z-axis of the liquid immersion position adjustment opening 140).

Therefore, the liquid immersion position adjustment opening 140 is formed such that the height of the upper end of the liquid immersion position adjustment opening 140 is lower than the height of the lower end of the optical coupling unit 115 (the upper end of the optical element 113), so that the liquid immersion position 201 is lower than the height of the optical coupling unit 115. For this reason, it is possible to suppress entry of the coolant 11 into the optical coupling unit 115.

The liquid immersion position adjustment opening 140 is formed so that the height of the upper end of the liquid immersion position adjustment opening 140 is higher than the height of the upper end of the heating element 114 (for example, the upper end of the drive circuit 212), so that the liquid immersion position 201 is higher than the height of the heating element 114. Therefore, the heating element 114 may be immersed in the coolant 11.

For example, in the Z-axis direction, the liquid immersion position adjustment opening 140 is formed such that the height of the upper end of the liquid immersion position adjustment opening 140 falls within the range 202 between the optical coupling unit 115 and the heating element 114. As a result, the heating element 114 may be immersed in the coolant 11 while suppressing entry of the coolant 11 into the optical coupling unit 115.

For example, the position of the upper end of the first cage member 120 in the Z-axis direction is taken as a reference position 203. The distance from the reference position 203 to the liquid immersion position adjustment opening 140 is denoted as D1. The distance from the reference position 203 to the lower end of the optical coupling unit 115 is denoted as D2. The distance from the reference position 203 to the heating element 114 is denoted as D3. In this case, the liquid immersion position adjustment opening 140 is formed at a position where D1>D2 and D1<D3. For example, in the Z-axis direction, the liquid immersion position adjustment opening 140 may be formed such that the height of the upper end of the liquid immersion position adjustment opening 140 falls within the range 202 between the optical coupling unit 115 and the heating element 114.

For example, when the height of the upper end of the liquid immersion position adjustment opening 140 falls between the upper end and the lower end of the optical element 113 in the Z-axis direction, part of the lower end of the optical element 113 is also immersed in the coolant 11, so that the optical element 113 may be cooled by the coolant 11.

However, when the height of the upper end of the liquid immersion position adjustment opening 140 is close to the height of the lower end of the optical coupling unit 115 (the upper end of the optical element 113), the coolant 11 may enter the lower end of the optical coupling unit 115 due to slight inclination or vibration of the optical module 100.

Therefore, for example, as illustrated in FIG. 2, the liquid immersion position adjustment opening 140 may be formed such that the height of the upper end of the liquid immersion position adjustment opening 140 is sufficiently lower than the height of the lower end of the optical coupling unit 115 (the upper end of the optical element 113). As a result, even when there is slight inclination or vibration of the optical module 100, it is possible to suppress entry of the coolant 11 into the lower end of the optical coupling unit 115.

As described in FIG. 2, the position of the liquid immersion position adjustment opening 140 in the Z-axis direction is determined according to the positions of the optical coupling unit 115 and the heating element 114 in the QSFP module 110 in the Z-axis direction. When there is a plurality of positions of the optical coupling unit 115 and the heating element 114 in the QSFP module 110 in the Z-axis direction, the first cage member 120 may be formed such that the position of the liquid immersion position adjustment opening 140 in the Z-axis direction may be selected. The selection of the position of the liquid immersion position adjustment opening 140 will be described later (see, for example, FIG. 3, FIG. 4, FIG. 12, and FIG. 15).

(First Cage Member According to the Embodiment)

Figure 3:
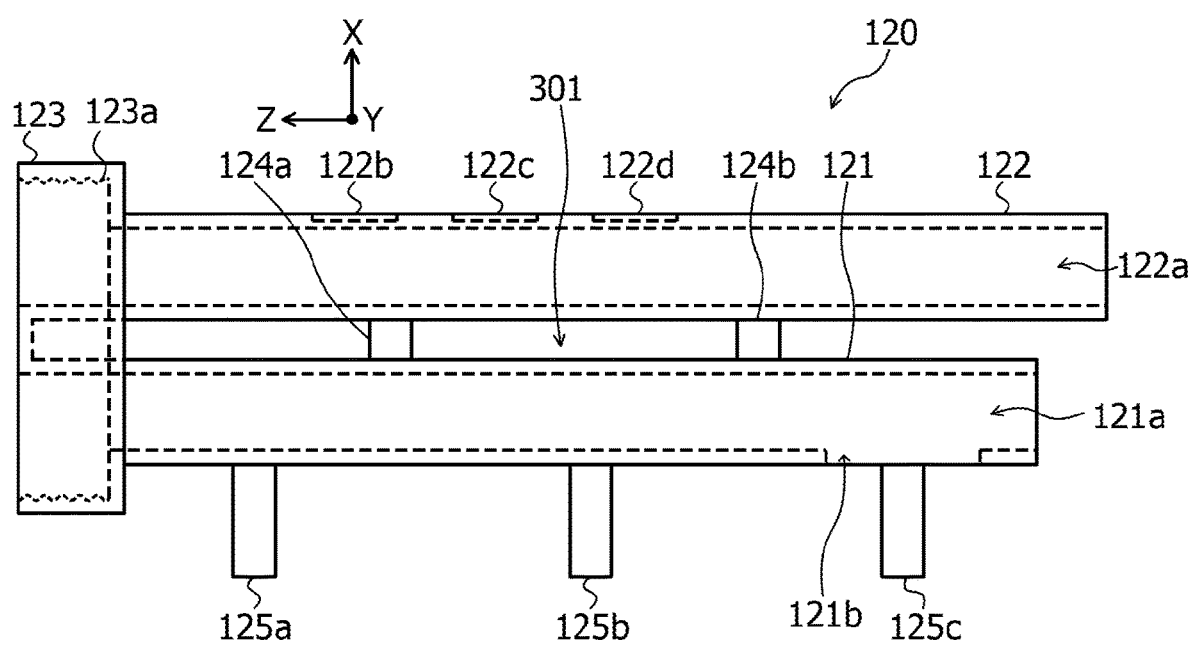
FIG. 3 is a front view illustrating an example of a first cage member according to the embodiment.
Figure 4:
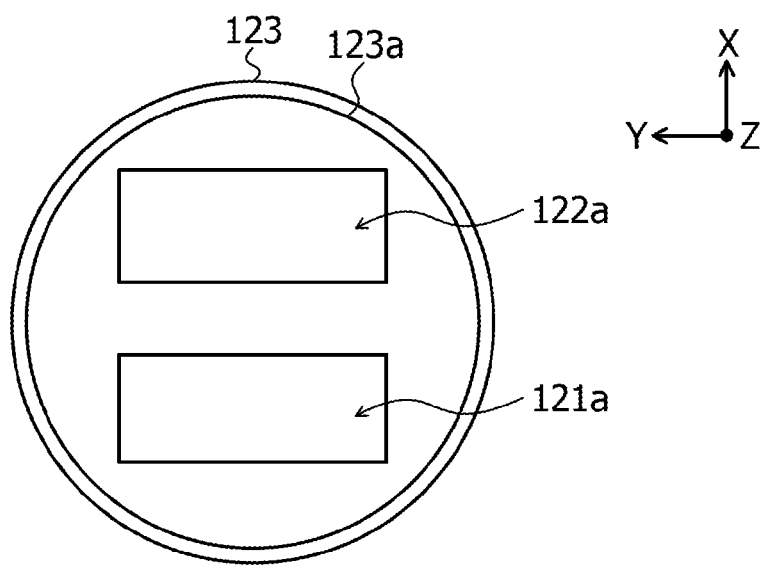
FIG. 4 is a side view illustrating an example of the first cage member according to the embodiment.
Figure 5:
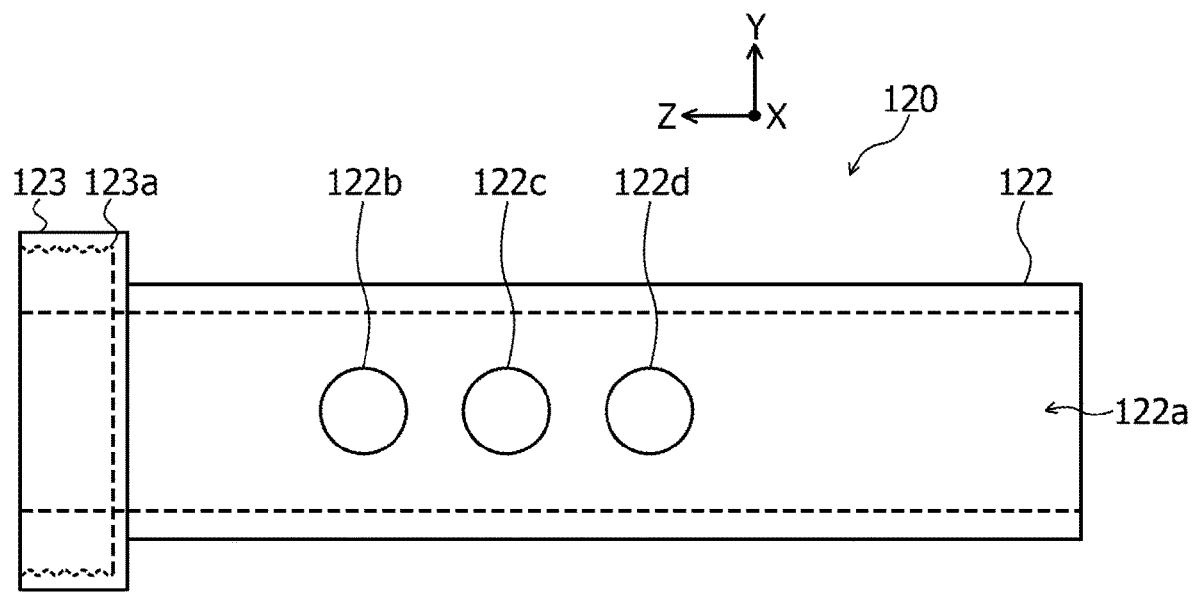
FIG. 5 is a top view illustrating an example of the first cage member according to the embodiment.

FIG. 3 is a front view illustrating an example of a first cage member according to the embodiment. FIG. 4 is a side view illustrating an example of the first cage member according to the embodiment. FIG. 5 is a top view illustrating an example of the first cage member according to the embodiment.

The first cage member 120 serves as a cage that fixes the main body of the QSFP module 110 to the printed circuit board 101 and that houses part of the optical cable 112 of the QSFP module 110. The main body of the QSFP module 110 is, for example, a portion excluding the optical cable 112 of the QSFP module 110. The first cage member 120 also serves as a cover that protects the optical coupling unit 115 of the QSFP module 110 from the coolant 11.

As illustrated in FIGS. 3 to 5, the first cage member 120 includes the first housing portion 121, the second housing portion 122, a fitting portion 123, joint portions 124a and 124b, and pins 125a, 125b, and 125c. The first cage member 120 is made by choosing a metal having high thermal conductivity such as stainless steel or copper, for example, to dissipate heat of the QSFP module 110. The first cage member 120 may be made by choosing not only these metals but also, for example, resin, glass, and the like.

Figure 7:
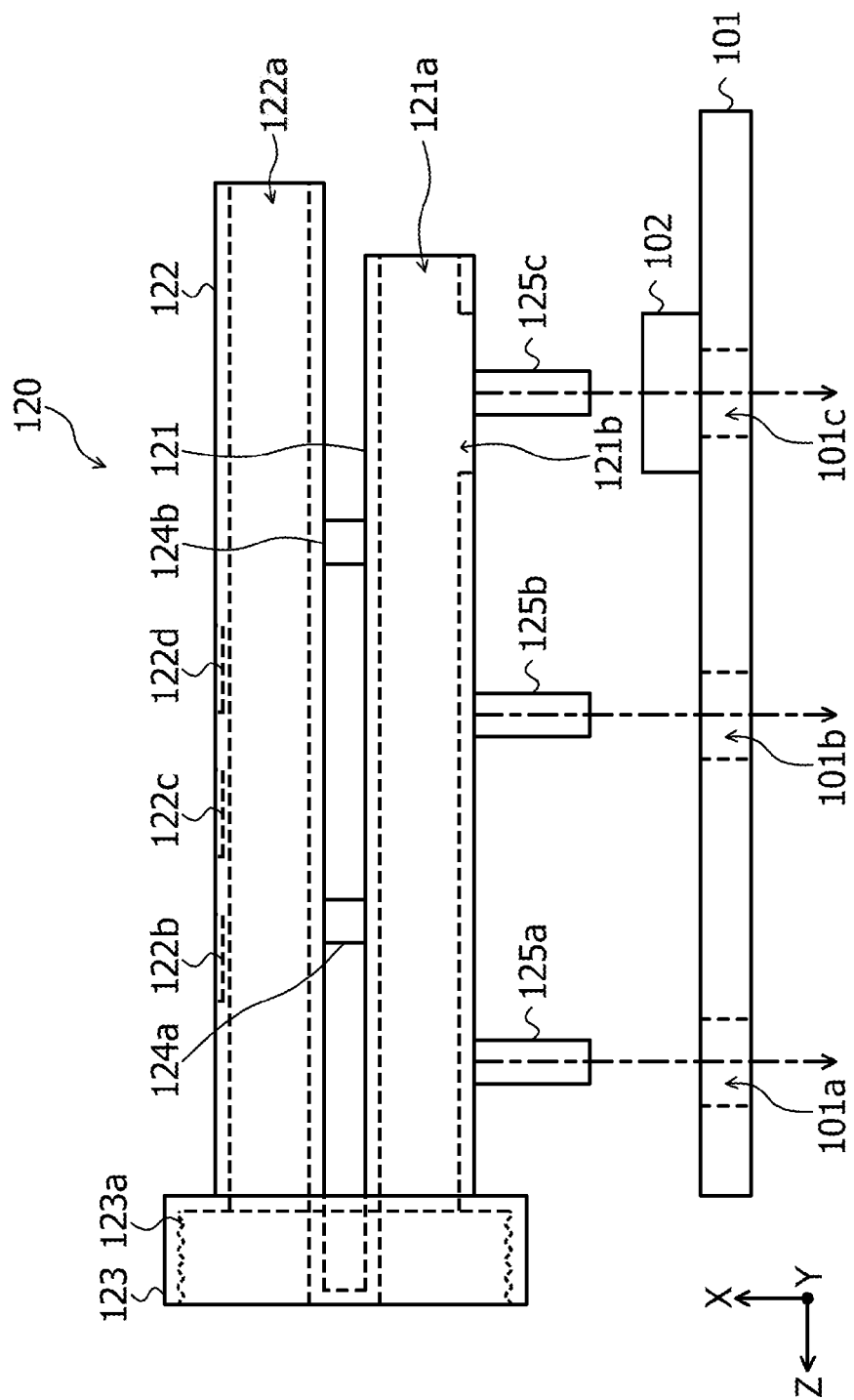
FIG. 7 is a diagram (part 1) illustrating an example of an assembly process of the optical module according to the embodiment.

The first housing portion 121 has the space 121a for housing the QSFP module 110 (see FIG. 9) and a connector insertion opening 121b into which the female QSFP connector 102 is inserted (see FIG. 7). The space 121a is a rectangular parallelepiped space that penetrates the first housing portion 121 in the Z-axis direction (the lateral direction in FIG. 3). The connector insertion opening 121b is a rectangular opening that is provided on the face of the first housing portion 121 at a position of the negative direction (the lower side in FIG. 3) of the X-axis and that communicates with the space 121a.

The second housing portion 122 has the space 122a for housing part of the optical cable 112 of the QSFP module 110 (see FIG. 10), and thin portions 122b, 122c, and 122d for punch-through work. The space 122a is a rectangular parallelepiped space that penetrates the second housing portion 122 in the Z-axis direction. The thin portions 122b, 122c, and 122d are thinner than other portions of the second housing portion 122, which are provided on part of the face of the second housing portion 122 at a position of the positive direction (the upper side in FIG. 3) of the X-axis. The thin portions 122b, 122c, and 122d are arranged at intervals in the Z-axis direction.

Each of the thin portions 122b, 122c, and 122d is thinner than the other portions, so that the thin portions 122b, 122c, and 122d may be easily penetrated by pressing, or cutting. By penetrating any one of the thin portions 122b, 122c, and 122d, the liquid immersion position adjustment opening 140 may be provided at the position of the thin portion which has been penetrated. For example, FIG. 1 illustrates an example in which the liquid immersion position adjustment opening 140 is provided by penetrating the thin portion 122b of the thin portions 122b, 122c, and 122d.

Thus, the thin portions 122b, 122c, and 122d arranged in the Z-axis direction are provided, and one of the thin portions 122b, 122c, and 122d is penetrated, whereby the position of the liquid immersion position adjustment opening 140 in the Z-axis direction may be selected. When a plurality of thin portions of thin portions 122b, 122c, and 122d are penetrated, the hole at a position of the most positive direction of the Z-axis among the plurality of holes generated by the penetration is the above-mentioned liquid immersion position adjustment opening 140.

Each of the thin portions 122b, 122c, and 122d is, for example, circular when viewed from the X-axis direction as illustrated in FIG. 5. However, the shape of the thin portions 122b, 122c, and 122d when viewed from the X-axis direction is not limited to a circle, and may be a rectangle, a triangle, or the like. The number of the thin portions (for example, thin portions 122b, 122c, and 122d) is not limited to three, and may be two, or four or more.

The fitting portion 123 is fixed to the first housing portion 121 and the second housing portion 122, and has a screw hole 123a for fitting with the second cage member 130 described above. The shape of the fitting portion 123 is obtained by combining a circular bottom portion when viewed from the Z-axis direction with an annular side wall portion provided to extend in the positive direction of the Z-axis along the outer periphery of the bottom portion. The screw hole 123a is provided on the inner periphery of the side wall portion of the fitting portion 123.

The bottom portion of the fitting portion 123 is provided with a rectangular opening communicating with the space 121a of the first housing portion 121 and the space 122a of the second housing portion 122. Therefore, for example, as illustrated in FIG. 4, when the fitting portion 123 is viewed from the positive direction of the Z-axis, the space 121a and the space 122a may be confirmed. As a result, the main body of the QSFP module 110 may be inserted into the space 121a and the optical cable 112 of the QSFP module 110 may be inserted into the space 122a from a position of the positive direction of the Z-axis.

As illustrated in FIG. 3, the joint portions 124a and 124b are partially provided between the first housing portion 121 and the second housing portion 122, and join first housing portion 121 and the second housing portion 122. As a result, a space 301 is formed between the first housing portion 121 and the second housing portion 122. The space 301 is open at least between the first housing portion 121 and the second housing portion 122 in the Y-axis direction, and communicates with the outside of the first cage member 120.

Therefore, as illustrated in FIG. 1, the coolant 11 also enters the space between the first housing portion 121 and the second housing portion 122. For this reason, for example, compared with the structure in which the first housing portion 121 and the second housing portion 122 are directly connected, the area of the portion at which the first housing portion 121 contacts the coolant 11 increases, so that the main body of the QSFP module 110 that is housed in the first housing portion 121 may be cooled efficiently.

The joint portions 124a and 124b may have various shapes such as, for example, a cylindrical shape, a triangular prism shape, and a quadrangular prism shape. The number of joint portions (for example, joint portions 124a and 124b) is not limited to two, and may be one, or three or more. For example, in the case where the first housing portion 121 and the second housing portion 122 may be fixed and spaced from each other with sufficient strength by the fitting portion 123, the joint portions 124a and 124b may not be provided.

The pins 125a, 125b, and 125c, which are provided on the face of the first housing portion 121 at a position of the negative direction of the X-axis, are pins protruding in the negative direction of the X-axis. The position of the pin 125c in the Z-axis direction is the same as the position of the connector insertion opening 121b, but the position in the Y-axis direction is different from the position of the connector insertion opening 121b.

The pins 125a, 125b, and 125c may have various shapes such as, for example, a cylindrical shape, a triangular prism shape, a quadrangular prism shape, a conical shape, a triangular pyramid shape, and a quadrangular pyramid shape. The number of the pins (for example, pins 125a, 125b, and 125c) is not limited to three, and may be one, two, or four or more.

(Second Cage Member According to the Embodiment)

Figure 6:
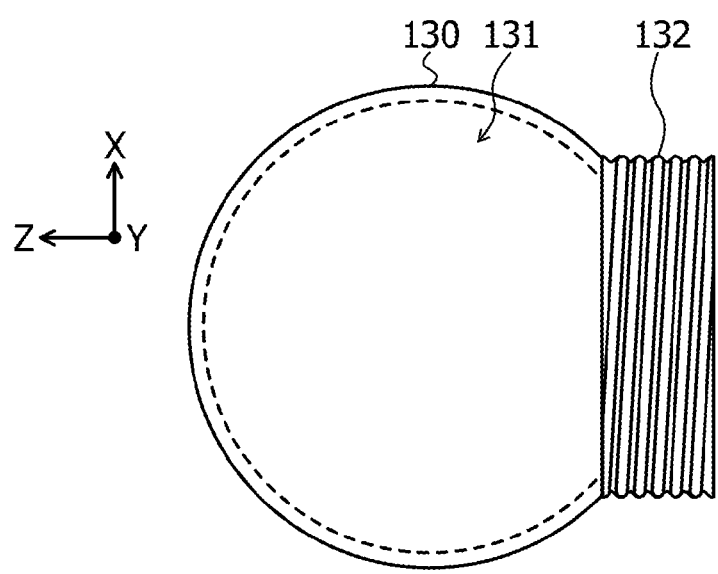
FIG. 6 is a front view illustrating an example of a second cage member according to an embodiment.

FIG. 6 is a front view illustrating an example of a second cage member according to an embodiment. The second cage member 130 serves as a cage that houses part (folded portion) of the optical cable 112 of the QSFP module 110. The second cage member 130 also serves as a lid that maintains the airtightness of the container formed by the first cage member 120 and the second cage member 130.

As illustrated in FIG. 6, the second cage member 130 has the spherical space 131 for folding and housing part of the optical cable 112 of the QSFP module 110 and a screw groove 132 fitted into the screw hole 123a illustrated in FIGS. 3 to 5. The second cage member 130 is opened on the negative direction (right side in FIG. 6) of the Z-axis, and part of the optical cable 112 may be housed in the space 131 from this opening.

For example, as illustrated in FIG. 1, the folded portion of the optical cable 112 is housed in the space 131 of the second cage member 130. The minimum bending radius (for example, 10 to 30 mm) for maintaining the light transmission characteristics is defined for the optical cable 112. The size and shape of the second cage member 130 are such that the folded portion of the optical cable 112 may be housed in a state where the bending radius of the folded portion of the optical cable 112 is equal to or more than the minimum bending radius. As an example, the size and shape of the second cage member 130 are determined such that the space 131 is spherical with a radius of about 40 mm.

As with the first cage member 120, the second cage member 130 is made by choosing, for example, a metal such as stainless steel or copper. However, the second cage member 130 is not limited to be made of metal, and may be made by choosing, for example, resin or glass. The external shape of the second cage member 130 and the space 131 is not limited to a spherical shape, but may have various shapes.

(Assembly Process of Optical Module According to the Embodiment)

FIGS. 7 to 12 illustrate an example of an assembly process of the optical module according to the embodiment. First, as illustrated in FIG. 7, the first cage member 120 illustrated in FIGS. 3 to 5 is mounted on the printed circuit board 101. The printed circuit board 101 is provided with through holes 101a, 101b, and 101c in accordance with the positions of the pins 125a, 125b, and 125c provided on the bottom face of the first cage member 120, respectively.

The mounting of the first cage member 120 on the printed circuit board 101 is performed such that the pins 125a, 125b, and 125c of the first cage member 120 are inserted into the through holes 101a, 101b, and 101c of the printed circuit board 101, respectively. As a result, the relative position on the YZ plane between the first cage member 120 and the printed circuit board 101 is adjusted to a predetermined relative position.

The female QSFP connector 102 is provided at a position corresponding to the connector insertion opening 121b of the first cage member 120 in the front surface (the upper surface in FIG. 7) of the printed circuit board 101. The female QSFP connector 102 may be electrically connected to the male QSFP connector 111 of the QSFP module 110.

The position of the female QSFP connector 102 in the Z-axis direction is the same as that of the through hole 101c, but the position in the Y-axis direction is different from that of the through hole 101c. When the first cage member 120 is mounted on the printed circuit board 101, the female QSFP connector 102 of the printed circuit board 101 enters the space 121a of the first housing portion 121 from the connector insertion opening 121b (see FIG. 8).

Figure 8:
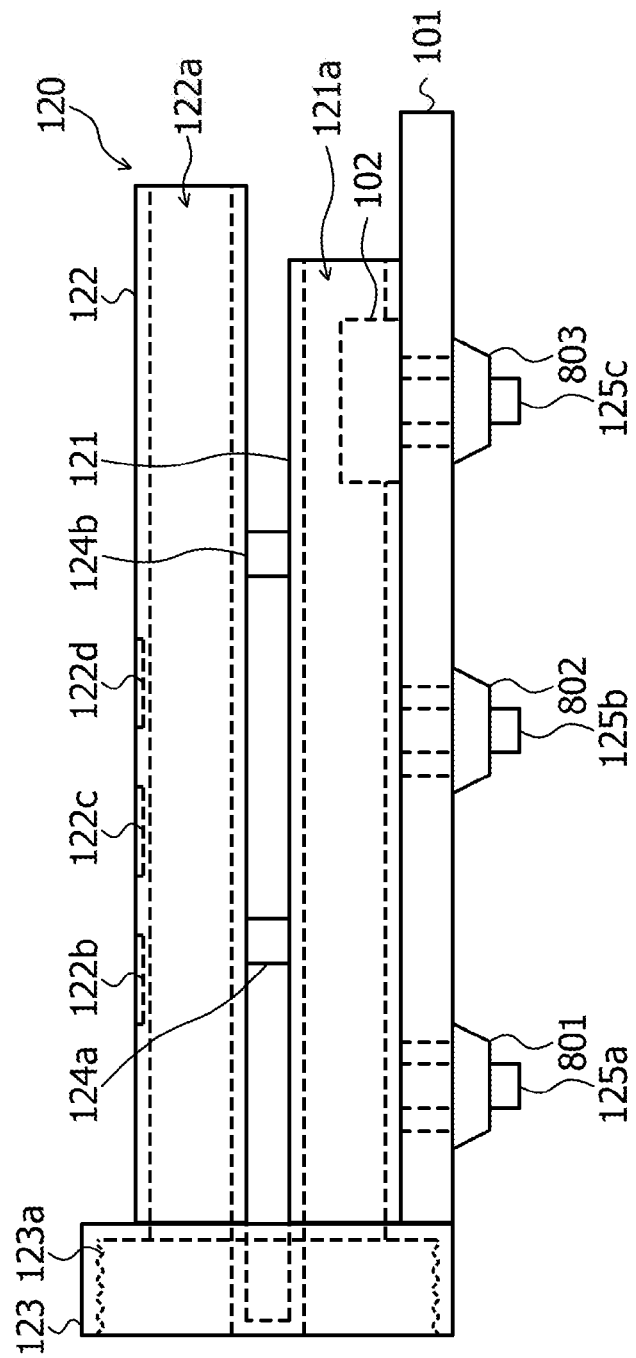
FIG. 8 is a diagram (part 2) illustrating an example of the assembly process of the optical module according to the embodiment.

Next, as illustrated in FIG. 8, the pins 125a, 125b, and 125c of the first cage member 120 are fixed to the through holes 101a, 101b, and 101c of the printed circuit board 101 by solders 801 to 803, respectively. As a result, the first cage member 120 and the printed circuit board 101 are fixed to each other.

The first cage member 120 including the pins 125a, 125b, and 125c may be formed of a conductor (metal), and a ground electrode may be provided on the back surface (the lower surface in FIG. 8) of the printed circuit board 101. In this case, the ground electrode on the back surface of the printed circuit board 101 and the first cage member 120 are electrically connected to each other via the solders 801 to 803.

As a result, the performance of the first cage member 120 as a ground for removing radiation noise may be improved, and the electrical characteristics of the electrical circuit inside the QSFP module 110 housed in the first housing portion 121 may be improved. The electrical circuit inside the QSFP module 110 is, for example, the CDR circuit 211 or the drive circuit 212 illustrated in FIG. 2. However, the fixing between the first cage member 120 and the printed circuit board 101 is not limited to the solders 801 to 803, and may be performed with an adhesive, for example.

Figure 9:
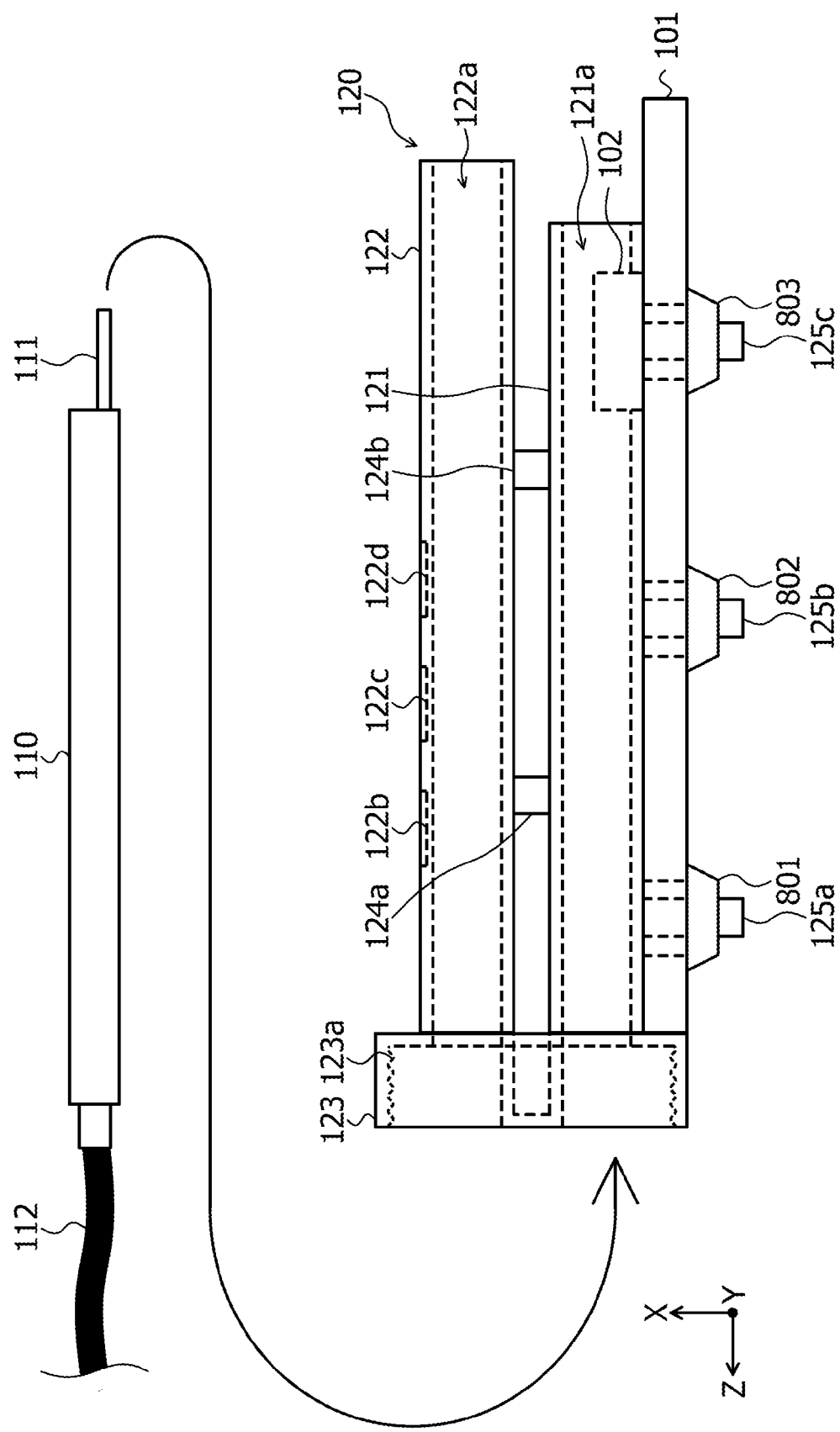
FIG. 9 is a diagram (part 3) illustrating an example of the assembly process of the optical module according to the embodiment.

Next, as illustrated in FIG. 9, the main body of the QSFP module 110 is inserted into the space 121a of the first housing portion 121 from the positive direction of the Z-axis through the opening at the bottom of the fitting portion 123. At this time, the QSFP module 110 is inserted in an orientation in which the male QSFP connector 111 of the QSFP module 110 is in the negative direction of the Z-axis and the optical cable 112 of the QSFP module 110 is in the positive direction of the Z-axis.

Figure 10:
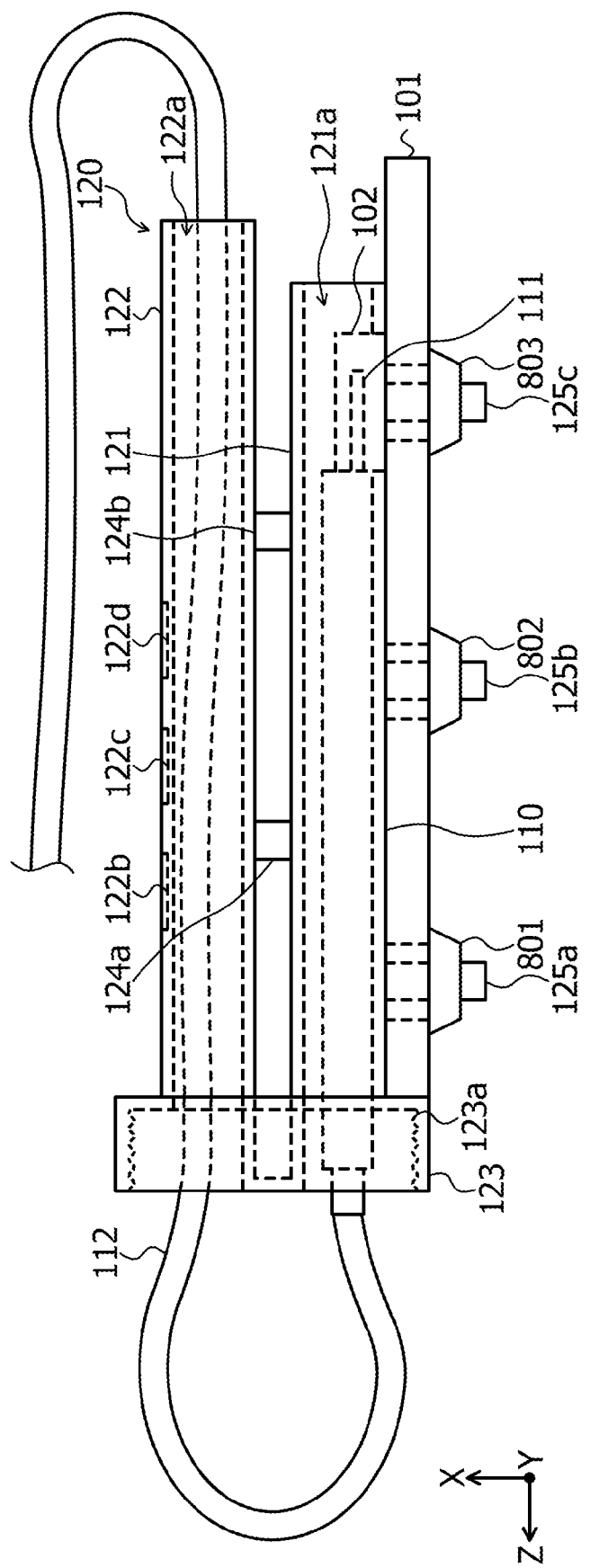
FIG. 10 is a diagram (part 4) illustrating an example of the assembly process of the optical module according to the embodiment.

As a result, the male QSFP connector 111 of the QSFP module 110 is connected to the female QSFP connector 102 of the printed circuit board 101 (see FIG. 10). The optical cable 112 of the QSFP module 110 is exposed from the first housing portion 121 in the positive direction of the Z-axis (see FIG. 10).

Next, as illustrated in FIG. 10, the optical cable 112 exposed from the first housing portion 121 is folded back so as to satisfy the above-described minimum bending radius, and the folded optical cable 112 is passed through the space 122a of the second housing portion 122. At this time, the folded optical cable 112 is passed from the positive direction of the Z-axis to the negative direction of the Z-axis. As illustrated in FIG. 10, the optical cable 112 may be passed through the space 122a, and the optical cable 112 exposed from the space 122a in the negative direction of the Z-axis may be further folded back and directed in the positive direction of the Z-axis.

Figure 11:
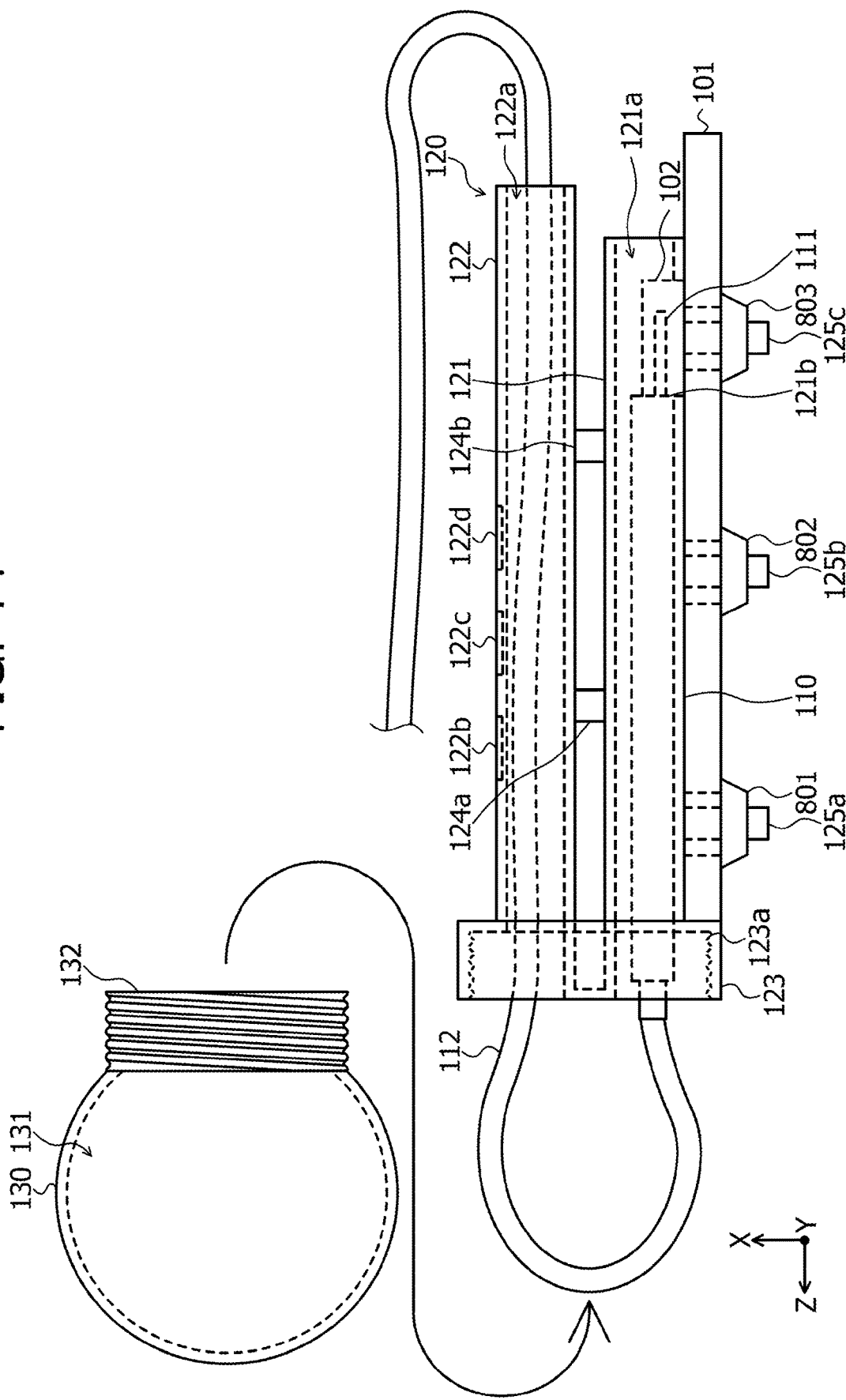
FIG. 11 is a diagram (part 5) illustrating an example of the assembly process of the optical module according to the embodiment.

Next, as illustrated in FIG. 11, the portion (exposed portion) of the optical cable 112 that is folded at a position of the positive direction of the Z-axis of the first housing portion 121 and the second housing portion 122 is inserted into the space 131 from the opening of the second cage member 130 at a position of the negative direction of the Z-axis. The screw groove 132 of the second cage member 130 is fitted into the screw hole 123a of the fitting portion 123 by rotating the second cage member 130 in a predetermined rotation direction around the Z-axis direction.

Figure 12:
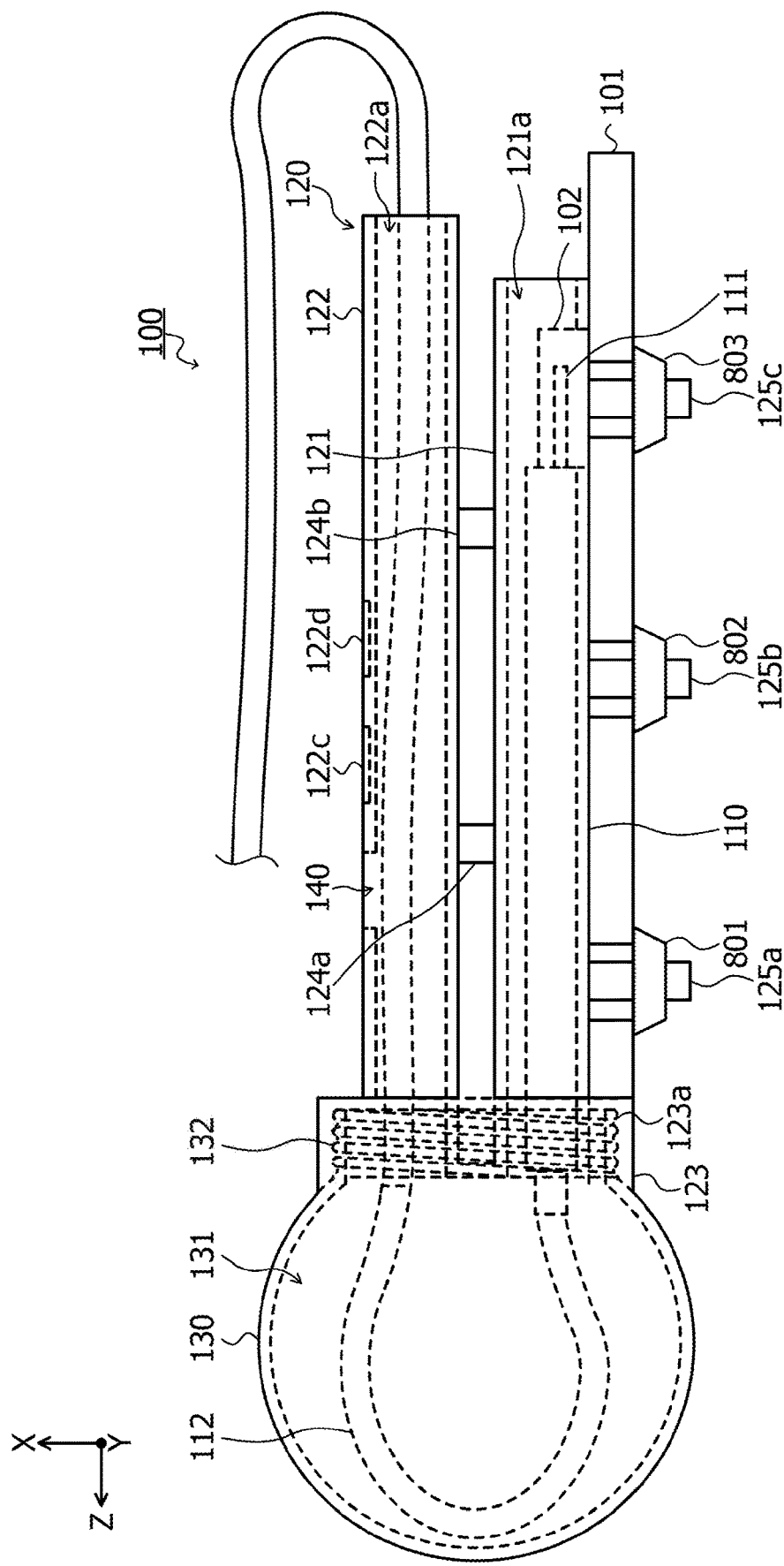
FIG. 12 is a diagram (part 6) illustrating an example of the assembly process of the optical module according to the embodiment.

As a result, the second cage member 130 is fixed to the first cage member 120 with no gap in a state in which the folded portion of the optical cable 112 is housed in the second cage member 130 (see FIG. 12). It is also possible to remove the second cage member 130 from the first cage member 120 by rotating the second cage member 130 in the direction opposite to the above-mentioned rotation direction about the Z-axis direction.

As illustrated in FIGS. 9 to 11, the second cage member 130 may be joined to the first cage member 120 which is in a state in which the main body of the QSFP module 110 is housed. Therefore, the second cage member 130 may be joined to the first cage member 120 after the main body of the QSFP module 110 is inserted from the positive direction of the Z-axis of the first cage member 120. Therefore, for example, the QSFP module 110 may be easily housed, compared with the case where the QSFP module 110 is housed in a container in which the first cage member 120 and the second cage member 130 are integrated.

Next, as illustrated in FIG. 12, the thin portion 122d of the second housing portion 122 is penetrated in the X-axis direction to provide the liquid immersion position adjustment opening 140, whereby the optical module 100 illustrated in FIG. 1 is completed. In the example illustrated in FIG. 12 (FIG. 1), while the thin portion 122d is penetrated, the thin portion 122b or the thin portion 122c instead of the thin portion 122d may be penetrated depending on the position of the optical coupling unit 115 or the heating element 114 in the Z-axis direction to provide a through hole.

The stage in which an operation of penetrating any one of the thin portions 122b, 122c, and 122d is performed is not restricted to the stage illustrated in FIG. 12. For example, the operation of penetrating any one of the thin portions 122b, 122c, and 122d may be performed before mounting the first cage member 120 on the printed circuit board 101 as illustrated in FIG. 7. The operation of penetrating any one of the thin portions 122b, 122c, and 122d may be performed at any stage illustrated in FIGS. 7 to 11.

When the positions of the optical coupling unit 115 and the heating element 114 in the Z-axis direction are determined, the liquid immersion position adjustment opening 140 may be provided in advance without providing the thin portions 122b, 122c, and 122d on the first cage member 120.

The state illustrated in FIG. 1 is obtained by immersing the optical module 100 illustrated in FIG. 12 into the coolant 11 in a state in which the negative direction of the Z-axis is downward (directed to the direction of gravity), that is, the second cage member 130 is upward and the first cage member 120 is downward.

Except for a portion that is open to the positive direction of the Z-axis via the fitting portion 123, the connector insertion opening 121b, and a portion that is open to the negative direction of the Z-axis, the space 121a does not communicate with the space outside the first cage member 120. Except for a portion that is open to the positive direction of the Z-axis via the fitting portion 123, the liquid immersion position adjustment opening 140, and a portion that is open to the negative direction of the Z-axis, the space 122a does not communicate with the space outside the second housing portion 122.

Except for a portion that is open to the negative direction of the Z-axis the space 131 of the second cage member 130 does not communicate with the space outside the second cage member 130. The second cage member 130 is fitted into the first cage member 120, so that a portion of the space 121a of the first housing portion 121 and a portion of the space 122a of the second housing portion 122 both of which are open to the negative direction of the Z-axis communicate with the space 131 of the second cage member 130.

As a result, the space 131 communicates with the portions of the spaces 121a and 122a at a position of the positive direction of the Z-axis relative to the liquid immersion position adjustment opening 140, and, as described in FIG. 1, a container is formed in which a portion on the positive direction of the Z-axis relative to the liquid immersion position adjustment opening 140 is sealed.

(Another Example of the Liquid Immersion System According to the Embodiment)

Figure 13:
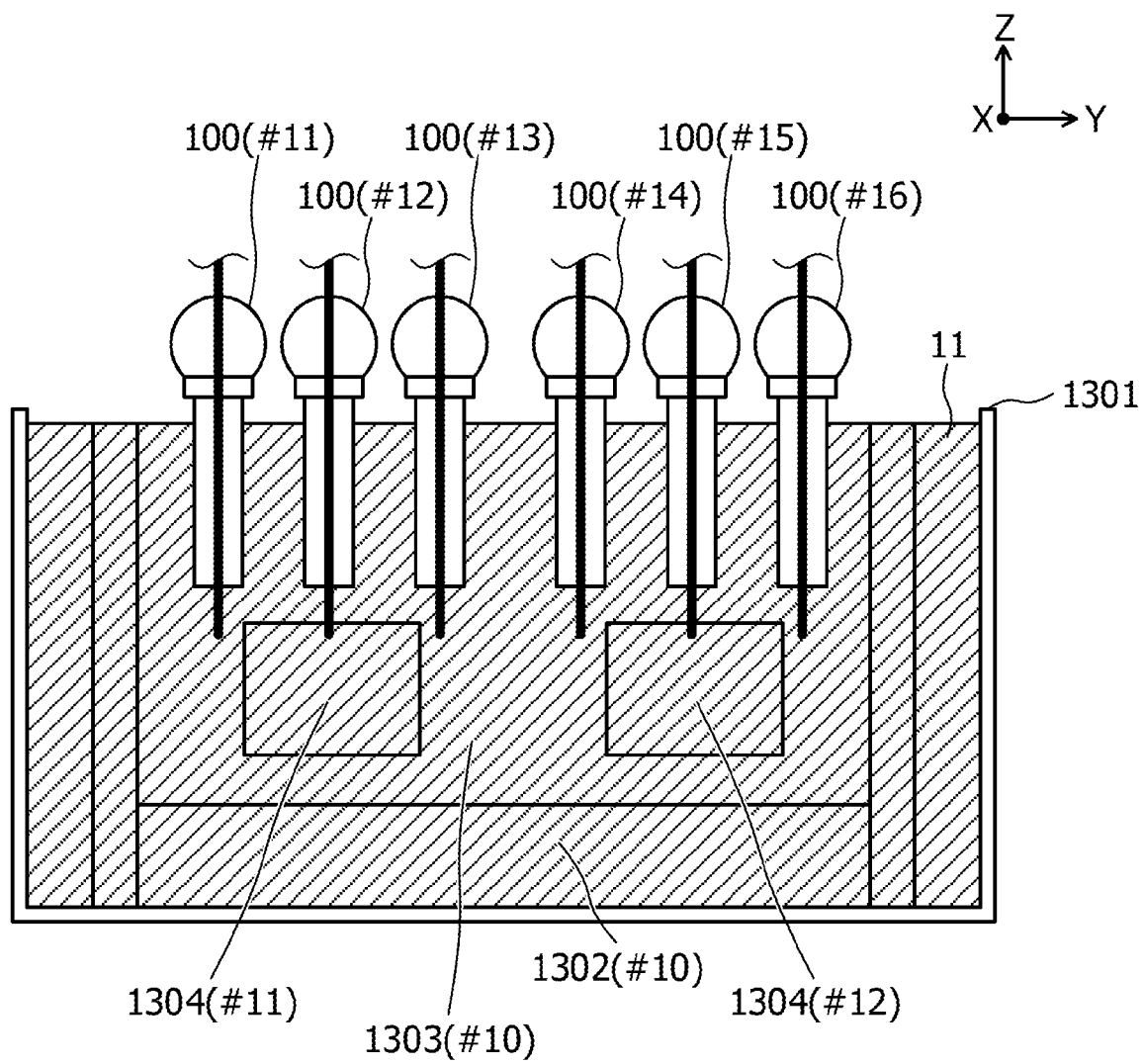
FIG. 13 is a front view illustrating another example of a liquid immersion system according to an embodiment.
Figure 14:
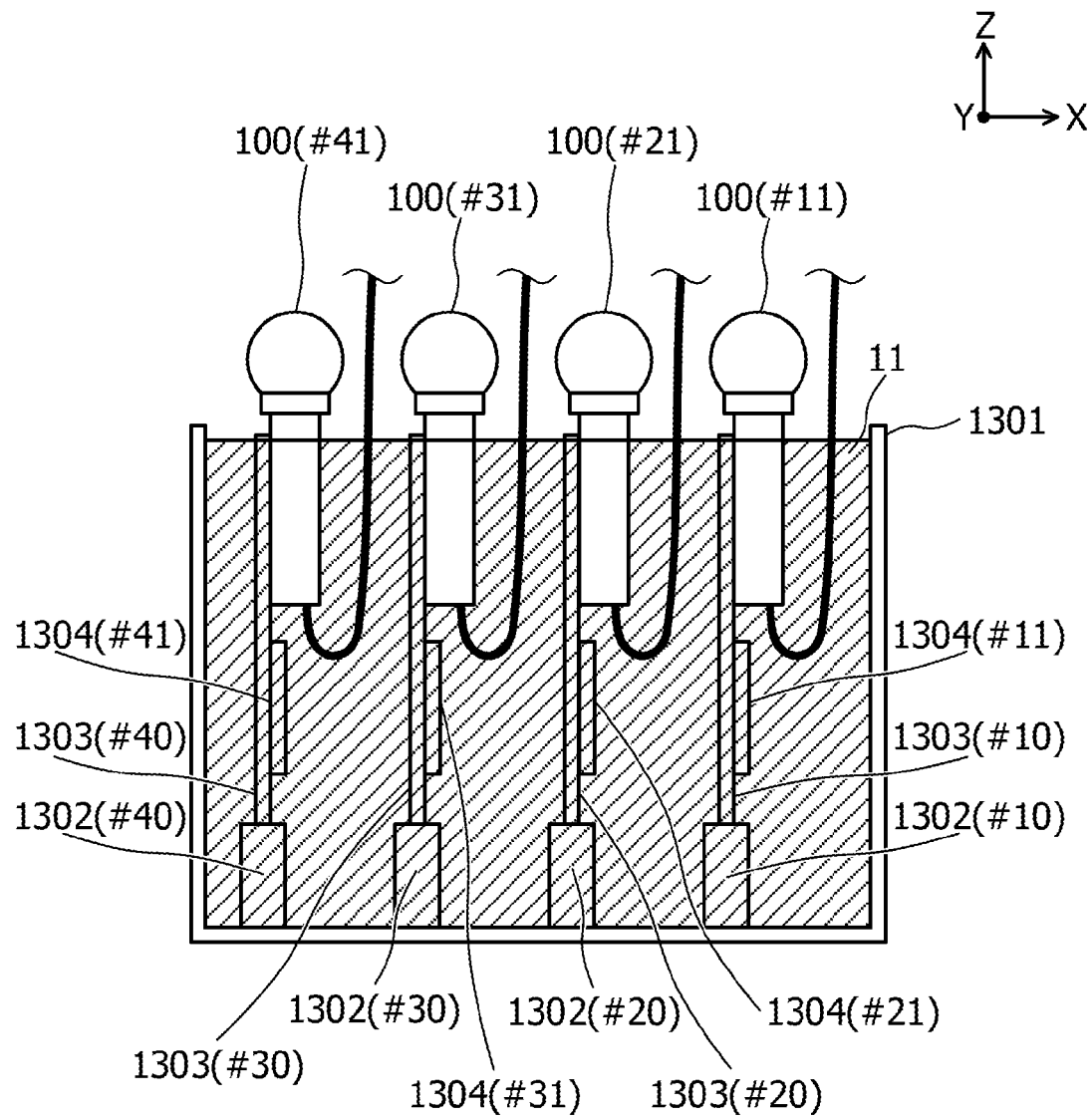
FIG. 14 is a side view illustrating another example of a liquid immersion system according to an embodiment.

FIG. 13 is a front view illustrating another example of a liquid immersion system according to an embodiment. FIG. 14 is a side view illustrating another example of a liquid immersion system according to an embodiment. In FIGS. 13 and 14, the same parts as those illustrated in FIG. 1 are denoted by the same reference numerals and the description thereof will be omitted. Each of the 24 optical modules 100 (#11 to #16, #21 to #26, #31 to #36, and #41 to #46) illustrated in FIGS. 13 and 14 is the above-described optical module 100.

A water tank 1301 stores the coolant 11. The water tank 1301 is open to the positive direction of the Z-axis. Connectors 1302 (#10, #20, #30, #40) for communication are provided at the bottom inside the water tank 1301. The connectors 1302 (#10, #20, #30, #40) are arranged in the X-axis direction.

The connectors 1302 (#10, #20, #30, #40) may be inserted into and removed from the printed circuit boards 1303 (#10, #20, #30, #40), respectively. The connectors 1302 (#10, #20, #30, #40) electrically connect the printed circuit boards 1303 (#10, #20, #30, #40) into which the connectors 1302 (#10, #20, #30, #40) are inserted, respectively, and the communication device outside the water tank 1301.

Each of printed circuit boards 1303 (#10, #20, #30, #40) is similar to, for example, the printed circuit board 101 described above. However, for example, CPUs 1304 (#11 and #12) and optical modules 100 (#11 to #16) are provided on the front surface of the printed circuit board 1303 (#10). For example, the CPU 1304 (#11) controls communication via the connector 1302 (#1) between the optical modules 100 (#11 to #13) and a communication device outside the water tank 1301. The CPU 1304 (#12) controls communication via the connector 1302 (#1) between the optical modules 100 (#14 to #16) and a communication device outside the water tank 1301.

Similarly, a CPU 1304 (#21, #22) and optical modules 100 (#21 to #26) are provided on the front surface of the printed circuit board 1303 (#20). Similarly, a CPU 1304 (#31, #32) and optical modules 100 (#31 to #36) are provided on the front surface of the printed circuit board 1303 (#30). Similarly, a CPU 1304 (#41, #42) and optical modules 100 (#41 to #46) are provided on the front surface of the printed circuit board 1303 (#40).

Thus, in the example illustrated in FIGS. 13 and 14, the 24 optical modules 100 (#11 to #16, #21 to #26, #31 to #36, #41 to #46) are arranged in a matrix of 6×4. As described above, each of these optical modules 100 (#11 to #16, #21 to #26, #31 to #36, #41 to #46) may suppress the deterioration in the light transmission characteristics while cooling the heating element 114 to be cooled by the coolant 11.

(Another Example of the Position of the Liquid Immersion Position Adjustment Opening of the Optical Module According to the Embodiment)

Figure 15:
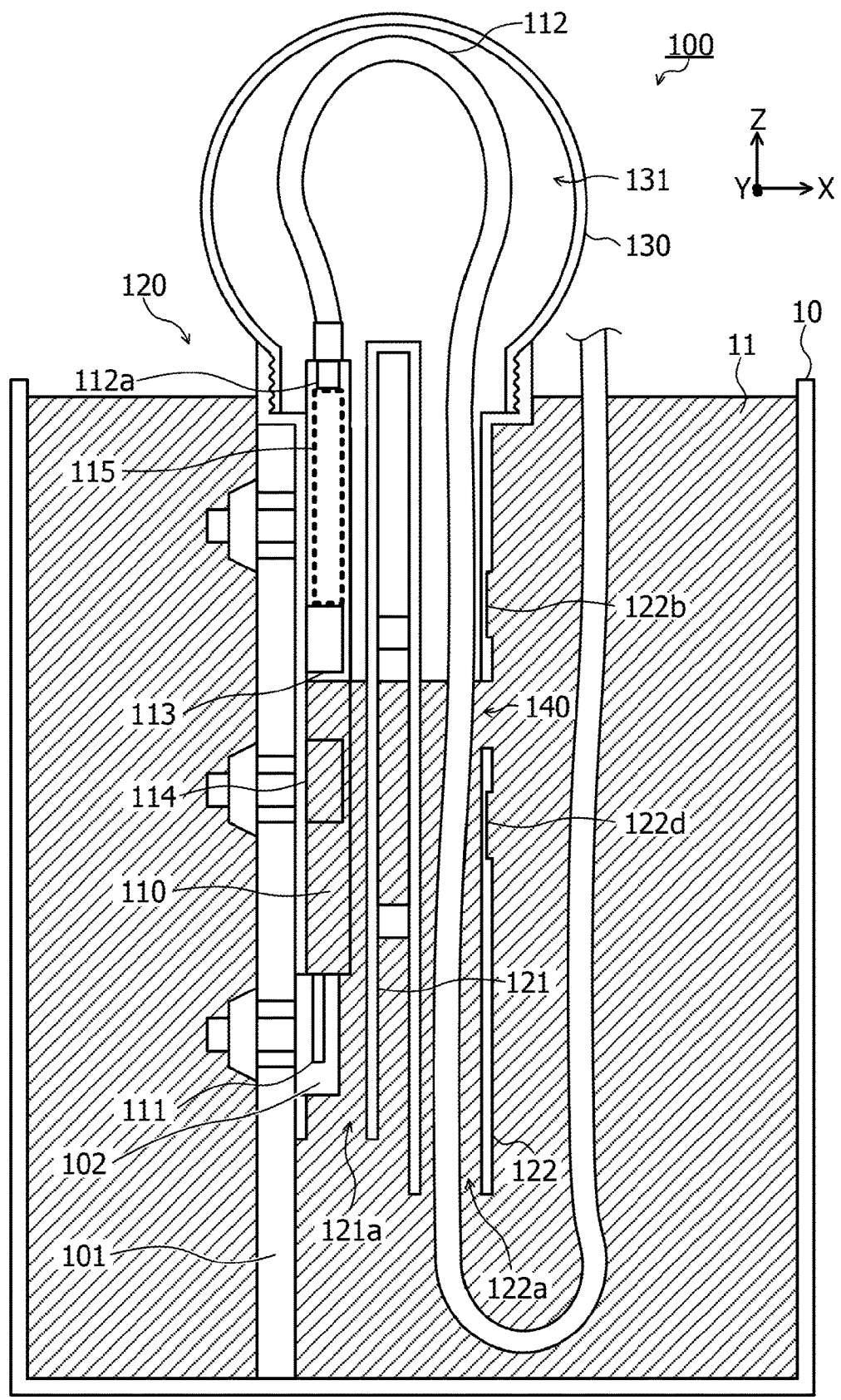
FIG. 15 is a front sectional view illustrating another example of the position of the liquid immersion position adjustment opening of the optical module according to the embodiment.

FIG. 15 is a front sectional view illustrating another example of the position of the liquid immersion position adjustment opening of the optical module according to the embodiment. In FIG. 15, the same parts as those illustrated in FIG. 1 are denoted by the same reference numerals and description thereof is omitted. In the example illustrated in FIG. 15, the optical element 113 and the heating element 114 of the QSFP module 110 are located at a position of the negative direction of the Z-axis relative to those in the example illustrated in FIG. 1. In this case, when the liquid immersion position adjustment opening 140 is located at the position illustrated in FIG. 1, the coolant 11 enters the optical coupling unit 115.

Therefore, in this case, as illustrated in FIG. 15, the liquid immersion position adjustment opening 140 is provided at a position of the negative direction of the Z-axis relative to that in the example illustrated in FIG. 1. For example, the liquid immersion position adjustment opening 140 is positioned such that the upper end of the liquid immersion position adjustment opening 140 falls between the lower end of the optical coupling unit 115 (the upper end of the optical element 113) and the upper end of the heating element 114 in the Z-axis direction.

As a result, the heating element 114 may be immersed in the coolant 11 while suppressing entry of the coolant 11 into the optical coupling unit 115. For example, in the optical module 100 illustrated in FIG. 11, the liquid immersion position adjustment opening 140 may be formed at the position illustrated in FIG. 15 by penetrating the thin portion 122c instead of the thin portion 122b.

(Another Example of the Optical Module According to the Embodiment)

Figure 16:
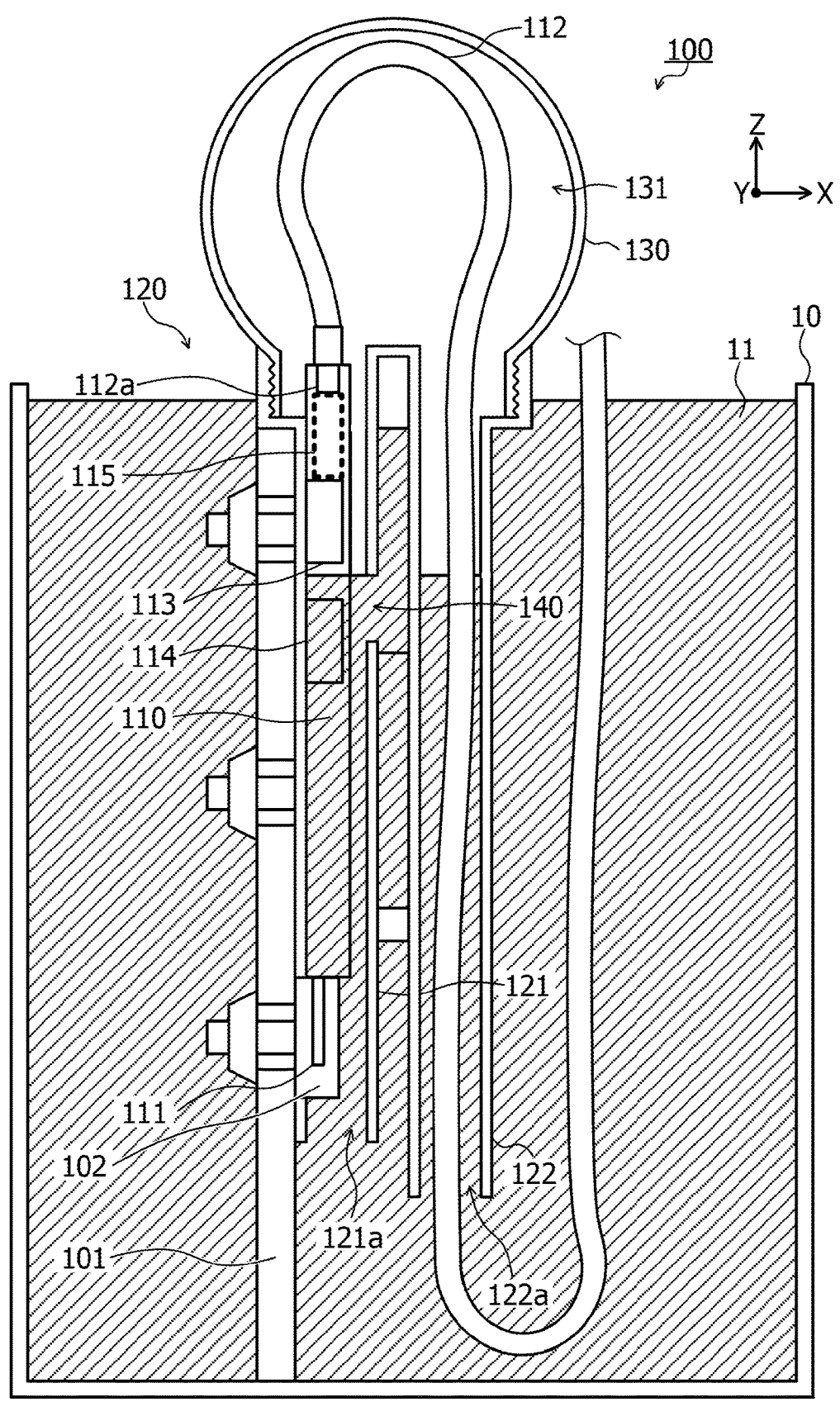
FIG. 16 is a front sectional view illustrating another example of an optical module according to an embodiment.

FIG. 16 is a front sectional view illustrating another example of an optical module according to an embodiment. In FIG. 16, the same parts as those illustrated in FIG. 1 are denoted by the same reference numerals and description thereof is omitted. Although the configuration in which the liquid immersion position adjustment opening 140 is provided on the face of the second housing portion 122 at a position of the positive direction of the X-axis has been described in FIG. 1 and the like, the position of the liquid immersion position adjustment opening 140 is limited thereto.

For example, as illustrated in FIG. 16, the liquid immersion position adjustment opening 140 may be provided on the face of the first housing portion 121 at a position of the positive direction of the X-axis (the face facing the second housing portion 122). Alternatively, the liquid immersion position adjustment opening 140 may be provided on the face of the second housing portion 122 at a position of the negative direction of the X-axis (the face facing the first housing portion 121).

Alternatively, the liquid immersion position adjustment opening 140 may be provided on the face of the first housing portion 121 or the second housing portion 122 at a position of the positive direction of the Y axis, or on the face of the first housing portion 121 or the second housing portion 122 at a position of the negative direction of the Y-axis. The liquid immersion position adjustment opening 140 may be provided such that the thin portions 122b, 122c, and 122d aligned in the Z-axis direction as illustrated in FIGS. 3 and 5, and the like are provided on these faces, and any one of the thin portions 122b, 122c, and 122d is penetrated.

In the configuration of the optical module 100 illustrated in FIG. 16, the position of the liquid immersion position adjustment opening 140 may be changed as illustrated in FIG. 15.

Figure 17:
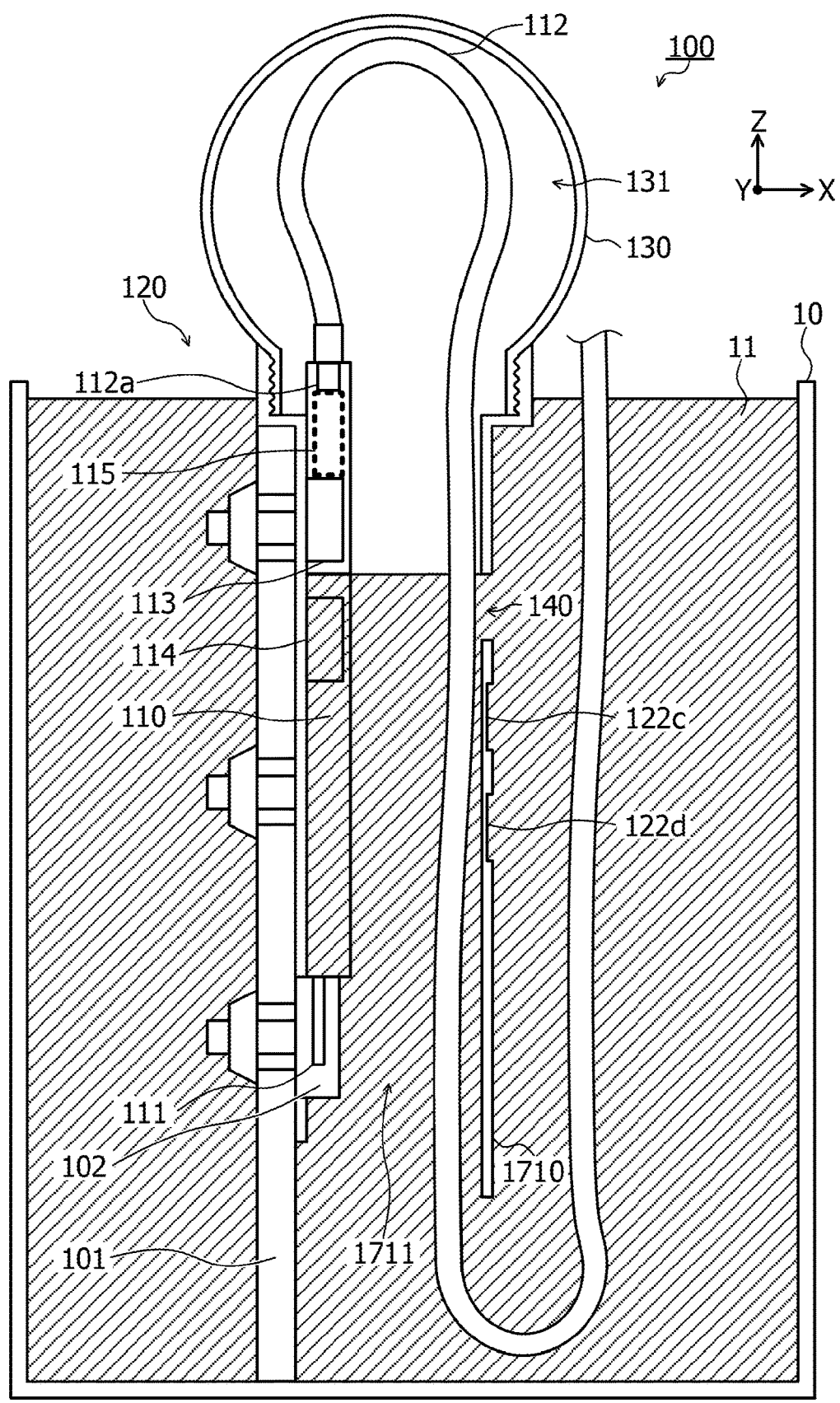
FIG. 17 is a front sectional view illustrating still another example of an optical module according to an embodiment.

FIG. 17 is a front sectional view illustrating still another example of an optical module according to an embodiment. In FIG. 17, the same parts as those illustrated in FIG. 1 are denoted by the same reference numerals and description thereof is omitted. In FIG. 1 and the like, the configuration in which the first cage member 120 includes the first housing portion 121, the second housing portion 122, and the fitting portion 123 has been described, but the present disclosure is not limited to such a configuration. For example, the first cage member 120 may include a housing portion 1710 and the fitting portion 123.

The housing portion 1710 has a rectangular parallelepiped space 1711 which penetrates the housing portion 1710 in the Z-axis direction (vertical direction in FIG. 17). The space 1711 houses the main body of the QSFP module 110 and a portion of the optical cable 112 wherein the portion is housed in the space 122a of the second housing portion 122 in the example illustrated in FIG. 1 and the like.

The face of the housing portion 1710 at a position of the negative direction of the X-axis is the same as the face of the first housing portion 121 described above at a position of the negative direction of the X-axis. The face of the housing portion 1710 at a position of the positive direction of the X-axis is the same as the face of the second housing portion 122 described above on the positive direction of the X-axis. For example, the housing portion 1710 has a shape in which the first housing portion 121 and the second housing portion 122 described above are coupled to form one housing portion.

In the configuration of the optical module 100 illustrated in FIG. 17, the position of the liquid immersion position adjustment opening 140 in the Z-axis direction may be changed as illustrated in FIG. 15. In the configuration of the optical module 100 illustrated in FIG. 17, the face on which the liquid immersion position adjustment opening 140 is provided may be changed as illustrated in FIG. 16.

Thus, the optical module 100 according to the embodiment includes the QSFP module 110 (optical transmission device) and a container (first cage member 120 and second cage member 130) that houses a portion of the QSFP module 110. For example, the container houses the portion of the QSFP module 110 including the heating element 114, the optical element 113, the optical coupling unit 115, and the one end 112a of the optical cable 112. The container also has the liquid immersion position adjustment opening 140 (opening) located between the heating element 114 and the optical coupling unit 115 in the direction in which the heating element 114 and the optical coupling unit 115 are arranged (Z-axis direction). The container is sealed at a portion located closer to the optical coupling unit 115 than the liquid immersion position adjustment opening 140 in the direction in which the heating element 114 and the optical coupling unit 115 are arranged (Z-axis direction).

As a result, the optical module 100 is immersed in the coolant 11 in an orientation in which the optical coupling unit 115 is above the heating element 114, so that the heating element 114 is immersed in the coolant 11, and the optical coupling unit 115 is not immersed in the coolant 11. Therefore, it is possible to suppress the degradation in the efficiency of the optical coupling in the optical coupling unit 115 while cooling the heating element 114 with the coolant 11, and to suppress the degradation in the light transmission characteristics in the QSFP module 110.

The container described above may include the first cage member 120 (first housing member) having the liquid immersion position adjustment opening 140, and the second cage member 130 (second housing member) coupled to the first cage member 120. The first cage member 120 houses the main body of the QSFP module 110 (the heating element 114, the optical element 113, and the optical coupling unit 115). In this case, the optical cable 112 extends from the one end 112a and is folded back to the first cage member 120 side inside the second cage member 130 to pass through at least part of the first cage member 120 to extend to the outside of the container. As a result, in the configuration in which the portion of the container at a position of the positive direction of the Z-axis relative to the liquid immersion position adjustment opening 140 is sealed, the optical cable 112 may be connected to another optical transmission device outside the container.

The second cage member 130 has, for example, the above-mentioned screw groove 132 so as to have a shape capable of being joined to the first cage member 120 which is in a state in which the main body of the QSFP module 110 is housed. As a result, housing the main body of the QSFP module 110 in the first cage member 120 before joining the second cage member 130 to the first cage member 120 makes it possible to house the main body of the QSFP module 110 in the first cage member 120.

The first cage member 120 may include the first housing portion 121 that houses the main body of the QSFP module 110 and the second housing portion 122 that houses part of the optical cable 112. In this case, the optical cable 112 extends from the one end 112a and is folded back to the first cage member 120 inside the second cage member 130 to pass through the second housing portion 122 to extend to the outside of the container. The space 301 communicating with the outside of the container exists between the first housing portion 121 and the second housing portion 122. As a result, the area of a portion of the first housing portion 121 housing the main body of the QSFP module 110 where the portion is in contact with the coolant 11 is increased, so that it is possible to efficiently cool the main body of the QSFP module 110 housed in the first housing portion 121.

As described above, according to the optical module and the liquid immersion system, it is possible to suppress the degradation of the light transmission characteristics when the heating element of the optical transmission device is cooled by a liquid.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical module comprising:
    an optical transmission device including a heating element, an optical element, an optical cable, and an optical coupling portion that performs optical coupling between the optical element and one end of the optical cable; and
    a container that houses the heating element, the optical element, the optical coupling portion, and a portion including the one end of the optical cable, the container having an opening which is located between the heating element and the optical coupling portion in an arrangement direction in which the heating element and the optical coupling portion are arranged and communicates with an outside of the container, the container having a portion which is generated by immersing a part of the container on a side of the heating element in the arrangement direction in the coolant of the tank and does not have another opening which communicates with the outside of the container, the portion including the optical element, the optical coupling portion and a part of the optical cable.

2. The optical module according to claim 1, wherein the optical coupling portion includes a space communicating with an inside of the container.

3. The optical module according to claim 1, wherein the container includes a first housing member that houses the heating element, the optical element, and the optical coupling portion and that has the opening, and a second housing member that is coupled to the first housing member and that houses part of the optical cable, and the optical cable extends from the one end, is folded back to the first housing member inside the second housing member, passes through at least part of the first housing member, and extends to an outside of the container.

4. The optical module according to claim 3, wherein the second housing member is shaped so as to be joined to the first housing member which is in a state in which the heating element, the optical element, and the optical coupling portion are housed.

5. The optical module according to claim 3, wherein the first housing member includes a first housing portion that houses the heating element, the optical element, and the optical coupling portion, and a second housing portion that houses part of the optical cable wherein a space communicating with the outside of the container exists between the first housing portion and the second housing portion, and the optical cable extends from the one end, is folded back to the first housing member inside the second housing member, passes through the second housing portion of the first housing member, and extends to the outside of the container.

6. A liquid immersion system comprising:
    a tank containing a coolant; and
    an optical module including an optical transmission device that includes a heating element, an optical element, an optical cable, and an optical coupling portion that performs optical coupling between the optical element and one end of the optical cable, and a container that houses the heating element, the optical element, the optical coupling portion, and a portion including the one end of the optical cable, the container having an opening which is located between the heating element and the optical coupling portion in an arrangement direction in which the heating element and the optical coupling portion are arranged and communicates with an outside of the container, the container having a portion which is generated by immersing a part of the container on a side of the heating element in the arrangement direction in the coolant of the tank and does not have another opening which communicates with the outside of the container, the portion including the optical element, the optical coupling portion and a part of the optical cable and the heating element being immersed in the coolant of the tank.

7. The liquid immersion system according to claim 6, wherein the heating element is immersed in the coolant, and the optical coupling portion is not immersed in the coolant.

8. The liquid immersion system according to claim 6, wherein the optical module is immersed in the coolant at a depth at which at least the opening is immersed in the coolant.

* * * * *